United States Patent
Kondou et al.

(10) Patent No.: US 9,222,962 B2
(45) Date of Patent: Dec. 29, 2015

(54) AUTOMATIC GAIN CONTROL APPARATUS, AUTOMATIC GAIN CONTROL METHOD, AND RECEIVER

(71) Applicant: Sony Corporation, Tokyo (JP)

(72) Inventors: Keitarou Kondou, Tokyo (JP); Makoto Noda, Tokyo (JP); Shinya Tamonoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/618,313

(22) Filed: Feb. 10, 2015

(65) Prior Publication Data

US 2015/0233981 A1    Aug. 20, 2015

(30) Foreign Application Priority Data

Feb. 17, 2014 (JP) ................................. 2014-027218

(51) Int. Cl.
| | | |
|---|---|---|
| *H04L 27/08* | (2006.01) | |
| *G01R 19/165* | (2006.01) | |
| *H04L 27/38* | (2006.01) | |
| *H03F 3/19* | (2006.01) | |
| *H03G 3/30* | (2006.01) | |

(52) U.S. Cl.
CPC ...... *G01R 19/16528* (2013.01); *G01R 19/1659* (2013.01); *H03F 3/19* (2013.01); *H03G 3/3042* (2013.01); *H04L 27/3809* (2013.01); *H03F 2200/451* (2013.01)

(58) Field of Classification Search
CPC ..................... G01R 19/16528; G01R 19/1659; H04L 27/3809

USPC ............... 375/316, 345, 346, 350; 455/232.1, 455/234.1, 245.1
See application file for complete search history.

(56) References Cited

U.S. PATENT DOCUMENTS

| | | | | |
|---|---|---|---|---|
| 8,909,183 | B2 * | 12/2014 | Morita ..................... | H04B 1/30 330/278 |
| 2008/0101215 | A1 * | 5/2008 | Tanaka ................. | H03G 3/3052 370/210 |
| 2012/0076246 | A1 * | 3/2012 | Okada et al. ............. | H04B 1/18 375/340 |
| 2015/0222373 | A1 * | 8/2015 | Tanaka ................... | H04B 17/21 455/226.2 |

FOREIGN PATENT DOCUMENTS

| | | |
|---|---|---|
| JP | 2002-247121 | 8/2002 |
| JP | 2002-290176 | 10/2002 |
| JP | 2012-175687 | 9/2012 |
| WO | WO-2008/139672 A1 | 11/2008 |

\* cited by examiner

*Primary Examiner* — Khanh C Tran
(74) *Attorney, Agent, or Firm* — Michael Best & Friedrich LLP

(57) ABSTRACT

An automatic gain control apparatus includes: a first counter configured to calculate a first count value that is the number of times when a voltage of an input signal exceeds a first voltage threshold within a predetermined period; a second counter configured to calculate a second count value that is the number of times when the voltage of the input signal drops below a second voltage threshold in the predetermined period; and an over-range detector configured to detect an over-range, based on a comparison result obtained by comparing either one of each of the first count value and the second count value and a calculation result of the first count value and the second count value with a predetermined threshold, and output a detection result.

15 Claims, 10 Drawing Sheets

AUTOMATIC GAIN CONTROL APPARATUS, AUTOMATIC GAIN CONTROL METHOD, AND RECEIVER

CROSS REFERENCE TO RELATED APPLICATIONS

This application claims the benefit of Japanese Priority Patent Application JP 2014-027218 filed Feb. 17, 2014, the entire contents of which are incorporated herein by reference.

BACKGROUND

The present technology relates to an automatic gain control apparatus, an automatic gain control method, and a receiver, and in particular to an automatic gain control apparatus, an automatic gain control method, and a receiver by which the gain control speed can be further increased.

In a transmission and reception system for communication/broadcasting and the like, there is known an automatic gain control apparatus (AGC) that controls a variable gain amplifier based on observed reception signal information for adjusting the level of a signal input into a signal processor of a receiver to fall in a predetermined range.

As one of the automatic gain control apparatuses, there is an automatic gain control apparatus including an over-range detection circuit that judges whether or not a voltage of an input signal input into an analog/digital (A/D) converter at a previous stage, for example, exceeds a threshold determined based on an allowable maximum voltage or the like of the A/D converter. If the over-range detection circuit judges that the voltage of the input signal exceeds the threshold determined based on the allowable maximum voltage or the like of the A/D converter, the automatic gain control apparatus changes the gain by a larger step in comparison with the normal gain control. For example, typically, the automatic gain control apparatus halves the gain.

One of the over-range detection circuits compares an average signal power of a signal input into an A/D converter with a threshold, to thereby detect an over-range (for example, see Japanese Patent Application Laid-open No. 2002-247121 (hereinafter, referred to as Patent Document 1)).

Further, another one of the over-range detection circuits compares an absolute value of the signal level of a signal input into an A/D converter, to thereby detect an over-range (for example, see PCT International Publication No. WO2008/139672, Japanese Patent Application Laid-open No. 2012-175687, and Japanese Patent Application Laid-open No. 2002-290176 (hereinafter, referred to as Patent Documents 2 to 4)).

SUMMARY

In recent years, in a high-speed wireless system using a millimeter wave that is standardized by IEEE (Institute of Electrical and Electronic Engineers) 802.15.3c, IEEE 802.11ad, or the like, it is often desirable to adjust the level of a signal input into a signal processor in about 1 μs from the packet start. It is more and more important to reduce the adjustment time.

However, immediately after a gain of a variable gain amplifier (VGA) is largely changed when an over-range is detected, a large offset may be caused in a signal output from the variable gain amplifier. For example, if an offset x is caused in the signal output from the variable gain amplifier, the average signal power is observed to be larger by $x^2$ and the signal level absolute value is observed to be larger by x. Therefore, in the method of comparing the average signal power or the signal level absolute value with the threshold as described above, the over-range is erroneously detected with a higher probability. As a result, the adjustment time is increased.

Offset convergence before over-range detection can reduce erroneous detection. However, the ratio of the offset convergence time to the adjustment time in the high-speed wireless system is, due to its reduced adjustment time, higher in comparison with a wireless system using a 2.4/5 GHz band in the related art. Therefore, if the over-range is judged after offset convergence, the gain control cannot be completed in a desired time.

In view of the above-mentioned circumstances, it is desirable to further increase the speed of gain control.

According to a first embodiment of the present technology, there is provided an automatic gain control apparatus including: a first counter configured to calculate a first count value that is the number of times when a voltage of an input signal exceeds a first voltage threshold within a predetermined period; a second counter configured to calculate a second count value that is the number of times when the voltage of the input signal drops below a second voltage threshold in the predetermined period; and an over-range detector configured to detect an over-range, based on a comparison result obtained by comparing either one of each of the first count value and the second count value and a calculation result of the first count value and the second count value with a predetermined threshold, and output a detection result.

According to the first embodiment of the present technology, there is provided an automatic gain control method for an automatic gain control apparatus including a first counter, a second counter, and an over-range detector, the method including: calculating, by the first counter, a first count value that is the number of times when a voltage of an input signal exceeds a first voltage threshold within a predetermined period; calculating, by the second counter, a second count value that is the number of times when the voltage of the input signal drops below a second voltage threshold in the predetermined period; and detecting, by the over-range detector, an over-range based on a comparison result obtained by comparing either one of each of the first count value and the second count value and a calculation result of the first count value and the second count value with a predetermined threshold and outputting a detection result.

According to a second embodiment of the present technology, there is provided a receiver, including: a first counter configured to calculate a first count value that is the number of times when a voltage of an input signal exceeds a first voltage threshold within a predetermined period; a second counter configured to calculate a second count value that is the number of times when the voltage of the input signal drops below a second voltage threshold in the predetermined period; and an over-range detector configured to detect an over-range based on a comparison result obtained by comparing either one of each of the first count value and the second count value and a calculation result of the first count value and the second count value with a predetermined threshold, and output a detection result.

In the first and second embodiments of the present technology, the first counter calculates the first count value that is the number of times when the voltage of the input signal exceeds the first voltage threshold within the predetermined period. The second counter calculates the second count value that is the number of times when the voltage of the input signal drops below the second voltage threshold in the predetermined period. The over-range detector detects the over-range, based on the comparison result obtained by comparing either one of each of the first count value and the second count value and the calculation result of the first count value and the second count value with the predetermined threshold, and outputs the detection result.

The automatic gain control apparatus and the receiver may be independent apparatuses or may be internal blocks configuring a single apparatus.

According to an embodiment of the present technology, it is possible to further increase the gain control speed.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out the present technology (hereinafter, referred to as embodiments) will be described with reference to the drawings. Note that descriptions thereof will be given in the following order.
1. Configuration Example of Wireless Communication System
2. First Embodiment of Automatic Gain Control Circuit (Configuration Example in Case Where A/D Converter Outputs Only Received Digital Signal r(t))
3. Second Embodiment of Automatic Gain Control Circuit (Configuration Example in Case Where A/D Converter Also Outputs Out-Of-Range Detection Signal)
4. Other Configuration Examples of Over-Range Detection Circuit <1. Configuration Example of Wireless Communication System>

Figure 1:
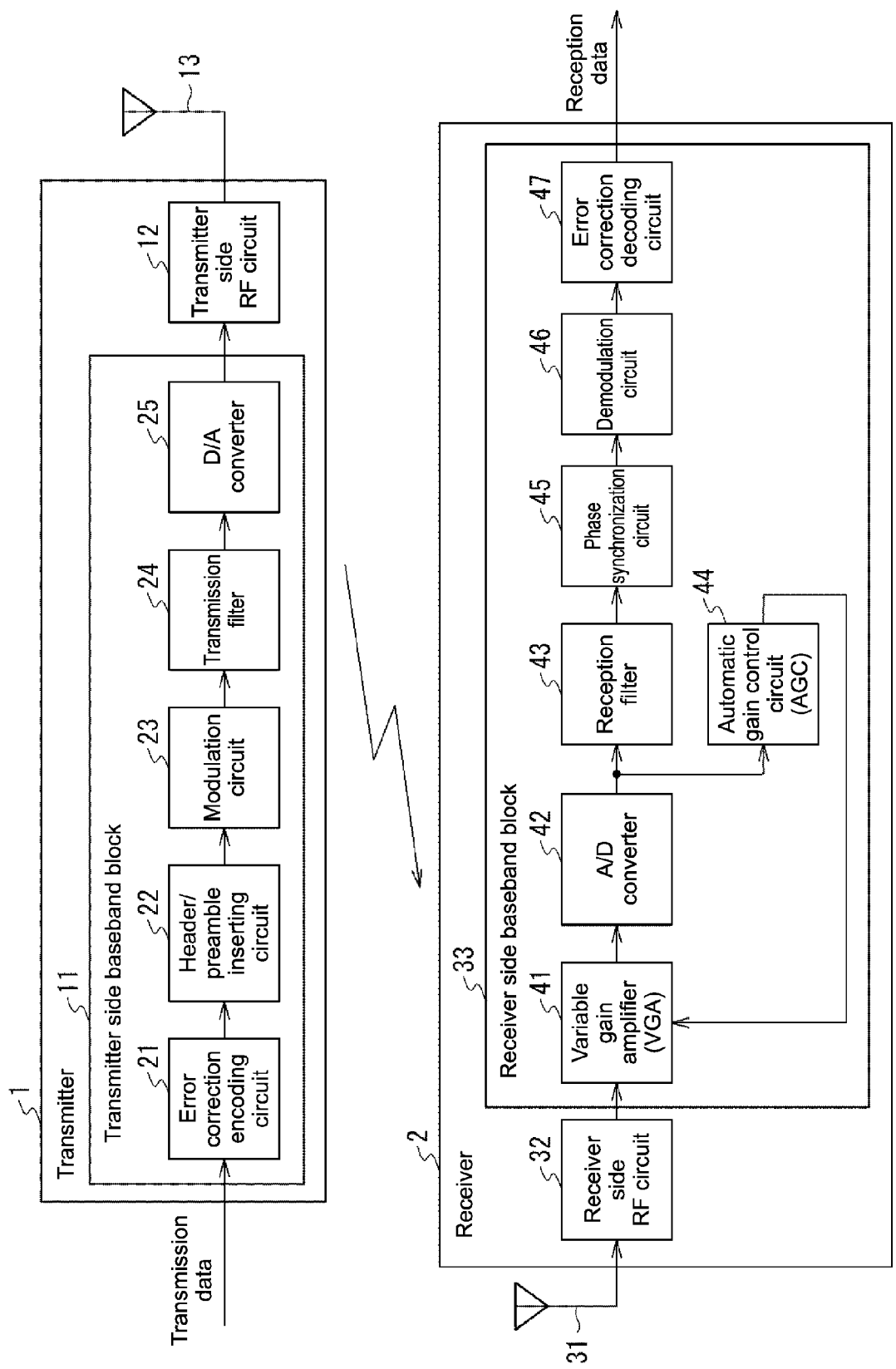
FIG. 1 is a block diagram showing a configuration example of an embodiment of a wireless communication system to which the present technology is applied.

FIG. 1 is a block diagram showing a configuration example of a wireless communication system to which the present technology is applied.

The wireless communication system of FIG. 1 includes a transmitter 1 and a receiver 2.

The transmitter 1 includes a transmitter side baseband block 11, a transmitter side radio-frequency (RF) circuit 12, and an antenna 13.

Transmission data that is transmission target data is input into the transmitter side baseband block 11 of the transmitter 1. The transmitter side baseband block 11 includes an error correction encoding circuit 21, a header/preamble inserting circuit 22, a modulation circuit 23, a transmission filter 24, and a digital/analog (D/A) converter 25.

For example, the error correction encoding circuit 21 generates, based on the transmission data, a parity used for error correction and performs error correction encoding by adding the generated parity to the transmission data. The error correction encoding circuit 21 outputs the transmission data after the error correction encoding to the header/preamble inserting circuit 22.

The header/preamble inserting circuit 22 inserts a header and preamble including various parameters to the transmission data supplied from the error correction encoding circuit 21 and outputs the resulting transmission data to the modulation circuit 23.

The modulation circuit 23 performs modulation such as quadrature phase shift keying (QPSK) modulation and binary phase shift keying (BPSK) modulation, to thereby transform the transmission data supplied from the header/preamble inserting circuit 22 into a transmission symbol series. The modulation circuit 23 outputs transmission symbols resulting from the transformation to the transmission filter 24.

The transmission filter 24 subjects the transmission symbols supplied from the modulation circuit 23 to filtering for band limitation and outputs the filtered transmission symbols to the D/A converter 25.

The D/A converter 25 digital-to-analog-converts the transmission symbols supplied from the transmission filter 24 and outputs an analog baseband signal resulting from the D/A conversion to the transmitter side RF circuit 12.

The transmitter side RF circuit 12 transmits a radio frequency signal (RF signal) obtained by superimposing the analog baseband signal supplied from the D/A converter 25 on a carrier having a predetermined frequency, as a transmission signal through the antenna 13.

The receiver 2 includes an antenna 31, a receiver side RF circuit 32, and a receiver side baseband block 33.

The receiver side baseband block 33 includes a variable gain amplifier (VGA) 41, an analog/digital (A/D) converter 42, a reception filter 43, an automatic gain control circuit (AGC) 44, a phase synchronization circuit 45, a demodulation circuit 46, and an error correction decoding circuit 47.

The transmission signal transmitted from the transmitter 1 is input into the receiver side RF circuit 32 through the antenna 31. The receiver side RF circuit 32 converts the RF signal supplied from the antenna 31 into the analog baseband signal and outputs the analog baseband signal to the receiver side baseband block 33.

The variable gain amplifier 41 of the receiver side baseband block 33 is a circuit capable of switching a gain according to the gain setting value from the automatic gain control circuit 44. The variable gain amplifier 41 amplifies the analog baseband signal according to the gain setting value and outputs the amplified analog baseband signal to the A/D converter 42.

The A/D converter 42 samples the analog baseband signal supplied from the variable gain amplifier 41 at a predetermined sampling cycle. The A/D converter 42 outputs data resulting from the sampling to the reception filter 43 and the automatic gain control circuit 44 as a reception digital signal r(t).

The reception filter 43 is configured by a finite impulse response (FIR) filter or the like. The reception filter 43 filters a reception signal supplied from the A/D converter 42 and outputs a reception digital signal r(t) after the filtering to the phase synchronization circuit 45.

The automatic gain control circuit 44 calculates, based on the reception digital signal r(t) from the A/D converter 42, a gain setting value for causing the signal level of the analog baseband signal input into the A/D converter 42 to fall within a predetermined range and outputs the gain setting value to the variable gain amplifier 41.

The phase synchronization circuit 45 realizes symbol synchronization based on the reception digital signal r(t) supplied from the reception filter 43. For example, the phase synchronization circuit 45 determines a reception symbol from the reception digital signal r(t) by performing interpolation or the like and outputs the determined reception symbol to the demodulation circuit 46.

The demodulation circuit 46 demodulates the reception symbol by a method corresponding to the modulation method in the transmitter 1, such as QPSK demodulation and BPSK demodulation and outputs reception data obtained by the demodulation to the error correction decoding circuit 47.

The error correction decoding circuit 47 performs an error correction on the reception data supplied from the demodulation circuit 46 and outputs the reception data after the error correction to an external apparatus.

In the receiver 2 of the thus configured wireless communication system, there is employed a configuration in which, due to the automatic gain control circuit 44, the signal level of the analog baseband signal input into the A/D converter 42 falls within a predetermined conversion voltage range at high speed. Hereinafter, a detailed configuration of the automatic gain control circuit 44 realizing the high-speed gain control will be described.

<2. First Embodiment of Automatic Gain Control Circuit>
<First Configuration Example of Automatic Gain Control Circuit>

First, the first embodiment of the automatic gain control circuit 44 will be described.

Figure 2:
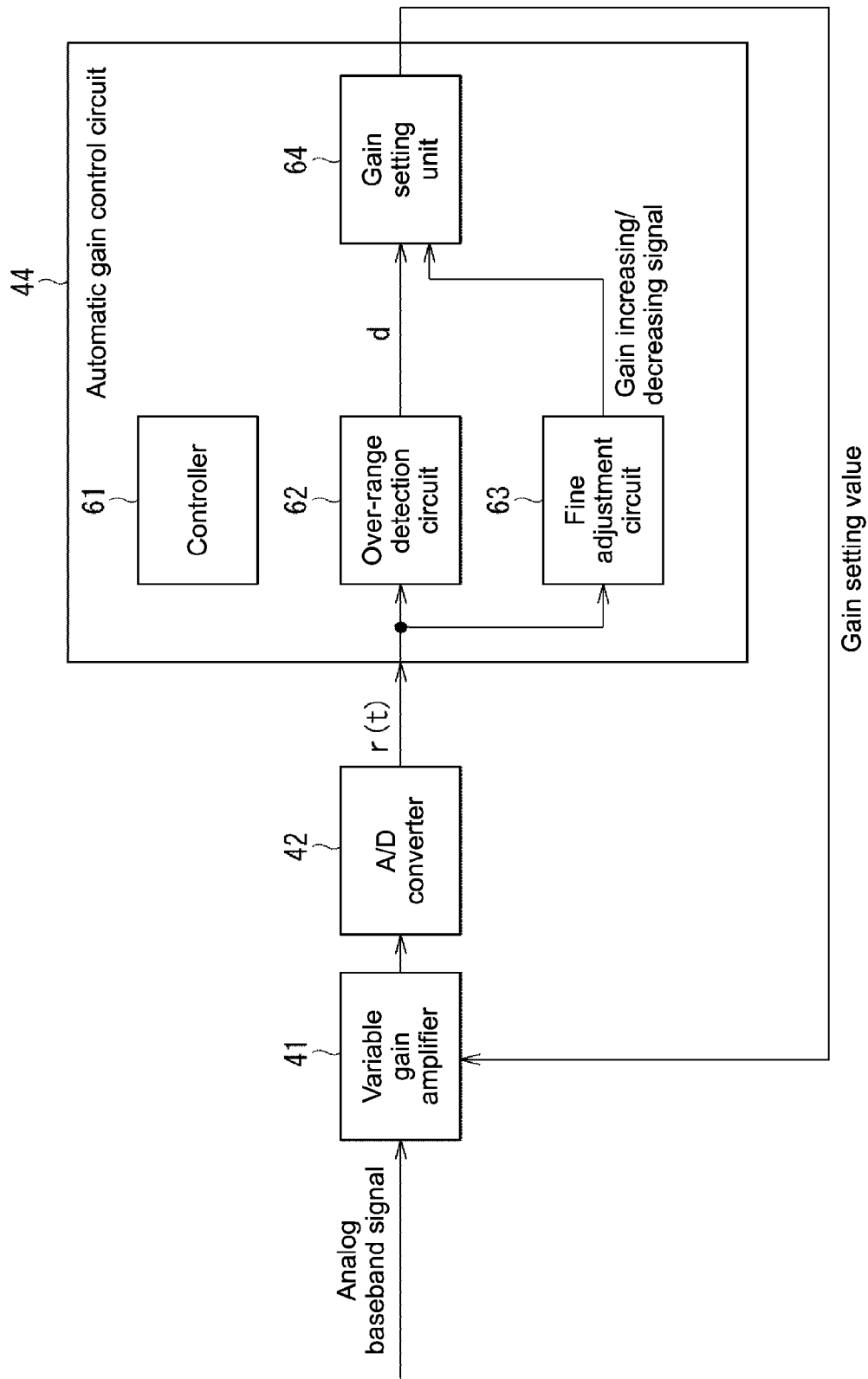
FIG. 2 is a block diagram showing a first embodiment of an automatic gain control circuit.

FIG. 2 is a block diagram of a detailed configuration example of the automatic gain control circuit 44 in the first embodiment. Note that FIG. 2 also shows, for the sake of easy understanding, the variable gain amplifier 41 and the A/D converter 42 at the previous stage of the automatic gain control circuit 44.

The automatic gain control circuit 44 includes a controller 61, an over-range detection circuit 62, a fine adjustment circuit 63, and a gain setting unit 64.

The controller 61 controls the respective sections of the over-range detection circuit 62, the fine adjustment circuit 63, and the gain setting unit 64. For example, based on whether or not the over-range detection circuit 62 has detected an over-range, the controller 61 determines which of an output of the over-range detection circuit 62 and an output of the fine adjustment circuit 63 the gain setting unit 64 uses.

The over-range detection circuit 62 observes the reception digital signal r(t) output from the A/D converter 42 and judges whether or not the input signal (analog baseband signal) into the A/D converter 42 is within the conversion voltage range of the A/D converter 42.

Then, the over-range detection circuit 62 outputs a judgment result to the gain setting unit 64 as an over-range detection signal d. Specifically, the over-range detection circuit 62 outputs, when the input signal into the A/D converter 42 is within the conversion voltage range of the A/D converter 42, an over-range detection signal d of, for example, d=0, and outputs, when the input signal into the A/D converter 42 is out of the conversion voltage range, an over-range detection signal d of d=1.

The fine adjustment circuit 63 detects a power difference between a power E of the reception digital signal r(t) output from the A/D converter 42 and a target level (target power value). Then, the fine adjustment circuit 63 outputs, when the power E of the reception digital signal r(t) is smaller than the target level, a signal for increasing the gain and outputs, when the power E of the reception digital signal r(t) is larger than the target level, a signal for decreasing the gain as a gain increasing/decreasing signal to the gain setting unit 64.

The gain setting unit 64 selects either one of the over-range detection signal d supplied from the over-range detection circuit 62 and the gain increasing/decreasing signal supplied from the fine adjustment circuit 63 as a gain controlling signal under the control of the controller 61. Then, the gain setting unit 64 determines, based on the selected gain controlling signal, a gain setting value and outputs the determined gain setting value to the variable gain amplifier 41.

<First Configuration Example of Over-Range Detection Circuit>

Figure 3:
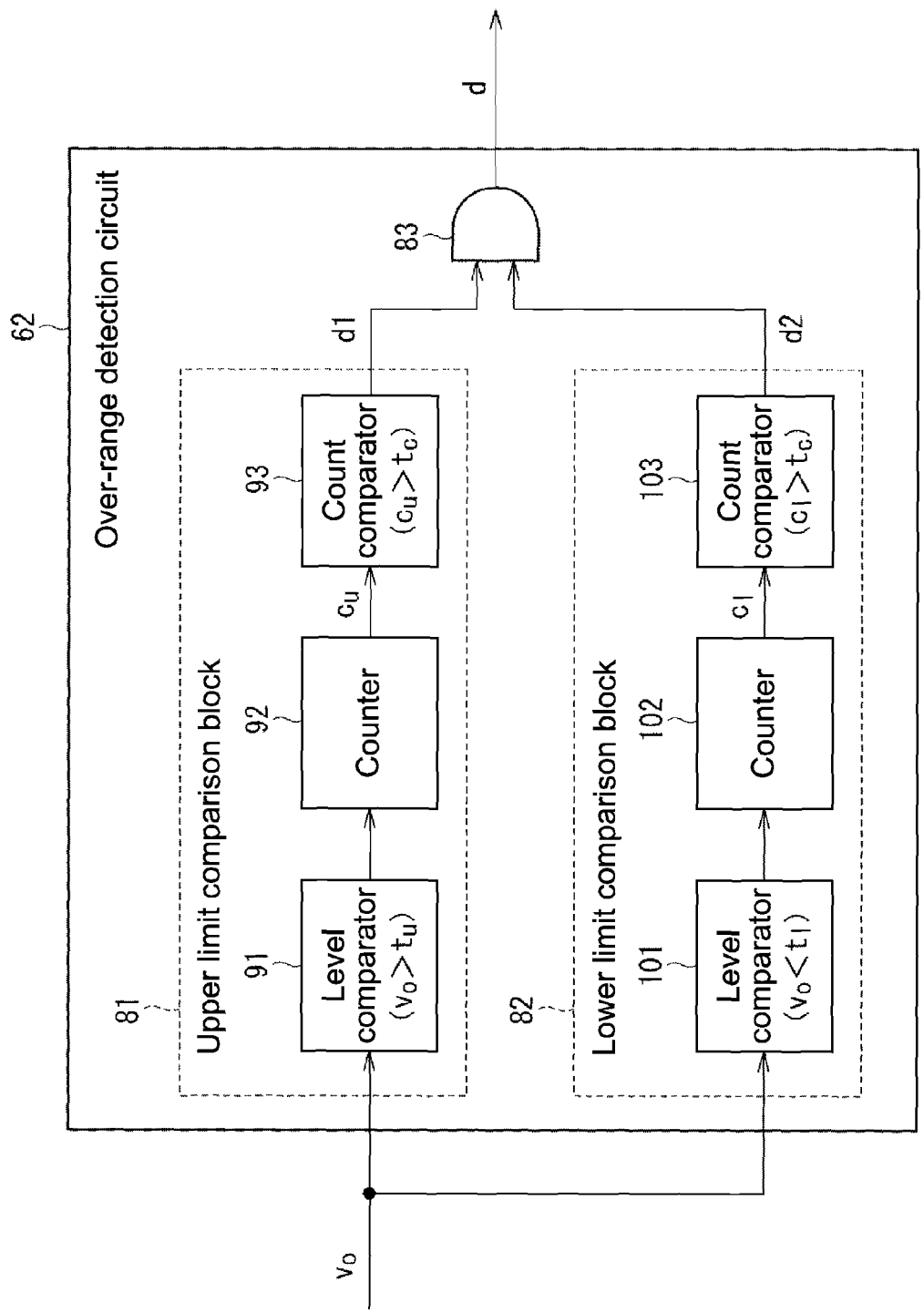
FIG. 3 is a block diagram showing a first configuration example of an over-range detection circuit.

FIG. 3 is a block diagram showing a detailed configuration example of the over-range detection circuit 62 of FIG. 2.

The over-range detection circuit 62 includes an upper limit comparison block 81, a lower limit comparison block 82, and an AND circuit 83.

The upper limit comparison block 81 judges whether or not the reception digital signal r(t) output from the A/D converter 42 is larger than an upper limit value of the conversion voltage range of the A/D converter 42 and outputs a judgment result as a range upper limit detection signal d1.

The upper limit comparison block 81 includes a level comparator 91, a counter 92, and a count comparator 93.

The level comparator 91 acquires the reception digital signal r(t) output from the A/D converter 42 at predetermined time intervals and compares the acquired reception digital signal r(t) with a threshold $t_u$ set in advance. Specifically, the level comparator 91 compares sample data (voltage level) $v_O$ for one step time acquired at a predetermined point of time with the threshold $t_u$ and outputs a comparison result thereof to the counter 92. Here, the threshold $t_u$ is set to a value smaller by one step than the upper limit value of the conversion voltage range of the A/D converter 42, for example.

The counter 92 counts, based on the comparison result supplied from the level comparator 91, the number of times when the sample data $v_O$ larger than the threshold $t_u$ is obtained (hereinafter, referred to as upper count value) $c_u$.

The comparison of the sample data $v_O$ with the threshold $t_u$ by the level comparator 91 and the count by the counter 92 are continuously performed within a predetermined period. It is assumed that an interval for acquiring the sample data $v_O$ is one-step time, the number of times for acquiring the sample data $v_O$ is T, and the predetermined period is a T-time. Then, after the T-time has elapsed, the counter 92 outputs the upper count value $c_u$ that is the number of times when the sample data $v_O$ larger than the threshold $t_u$ is obtained, to the count comparator 93.

The count comparator 93 compares the upper count value $c_u$ supplied from the counter 92 with a threshold $t_c$ set in advance.

Then, when the upper count value $c_u$ is larger than the threshold $t_c$, the count comparator 93 outputs the range upper limit detection signal d1 indicating that the reception digital signal r(t) is larger than the upper limit value of the conversion voltage range of the A/D converter 42. The range upper limit detection signal d1 in this case is set to one (d1=1).

Otherwise, when the upper count value $c_u$ is equal to or smaller than the threshold $t_c$, the count comparator 93 outputs the range upper limit detection signal d1 indicating that the reception digital signal r(t) is not larger than the upper limit value of the conversion voltage range of the A/D converter 42. The range upper limit detection signal d1 in this case is set to zero (d1=0).

The lower limit comparison block 82 judges whether or not the reception digital signal r(t) output from the A/D converter 42 is larger than a lower limit value of the conversion voltage range of the A/D converter 42 and outputs a judgment result as a range lower limit detection signal d2.

The lower limit comparison block 82 includes a level comparator 101, a counter 102, and a count comparator 103.

The level comparator 101 acquires the reception digital signal r(t) output from the A/D converter 42 at predetermined time intervals and compares the acquired reception digital signal r(t) to a threshold $t_l$ set in advance. Specifically, the level comparator 101 compares sample data (voltage level) $v_0$ for the one-step time that is acquired at a predetermined point of time with the threshold $t_l$ and outputs a comparison result thereof to the counter 102. Here, the threshold $t_l$ is set to a value larger by one step than the lower limit value of the conversion voltage range of the A/D converter 42, for example.

The counter 102 counts, based on the comparison result supplied from the level comparator 101, the number of times (hereinafter, referred to as lower count value) $c_l$ when the sample data $v_0$ smaller than the threshold $t_l$ is obtained.

The comparison of the sample data $v_0$ with the threshold $t_l$ by the level comparator 101 and the count by the counter 102 are continuously performed for the T-time set in advance. Then, after the T-time has elapsed, the counter 102 outputs the lower count value $c_l$ that is the number of times when the sample data $v_0$ smaller than the threshold $t_l$ is obtained, to the count comparator 103.

The count comparator 103 compares the lower count value $c_l$ supplied from the counter 102 with the threshold $t_c$ set in advance.

Then, when the lower count value $c_l$ is larger than the threshold $t_c$, the count comparator 103 outputs the range lower limit detection signal d2 indicating that the reception digital signal r(t) is larger than the lower limit value of the conversion voltage range of the A/D converter 42. The range lower limit detection signal d2 in this case is set to one (d2=1).

Otherwise, when the lower count value $c_l$ is equal to or smaller than the threshold $t_c$, the count comparator 103 outputs the range lower limit detection signal d2 indicating that the reception digital signal r(t) is not larger than the lower limit value of the conversion voltage range of the A/D converter 42. The range lower limit detection signal d2 in this case is set to zero (d2=0).

The AND circuit 83 calculates a logical product of the range upper limit detection signal d1 output from the upper limit comparison block 81 and the range lower limit detection signal d2 output from the lower limit comparison block 82 and outputs a calculation result thereof as the over-range detection signal d.

The AND circuit 83 configures the over-range detector that detects the over-range based on the comparison result obtained by comparing the upper count value $c_u$ and the lower count value $c_l$ with the threshold $t_c$.

<Processing Flow of Automatic Gain Control Processing>

Next, referring to the flowchart of FIG. 4, the automatic gain control processing by the automatic gain control circuit 44 of FIG. 2 will be described.

First, in Step S1, the automatic gain control circuit 44 performs rough control processing of controlling a gain such that the signal level of the reception digital signal r(t) output from the A/D converter 42 is within the conversion voltage range of the A/D converter 42. At a point of time when the signal level of the reception digital signal r(t) falls within the conversion voltage range of the A/D converter 42, the rough control processing of Step S1 is terminated and the processing proceeds to Step S2.

Details of the rough control processing of Step S1 will be described later with reference to the flowcharts of FIGS. 5 and 6.

In Step S2, the automatic gain control circuit 44 performs fine adjustment processing of adjusting a gain such that the power E of the reception digital signal r(t) output from the A/D converter 42 equals a target level.

The fine adjustment processing of Step S2 will be simply described.

The fine adjustment circuit 63 of the automatic gain control circuit 44 detects a signal power of a reception digital signal r(t) output from the A/D converter 42 and determines an average power value by multiplying the detected signal power with a time constant set in advance. Then, the fine adjustment circuit 63 calculates a power difference between the obtained average power value and the target level (target power value) and outputs a gain increasing/decreasing signal for increasing/decreasing the gain value according to the calculated power difference to the gain setting unit 64.

The gain setting unit 64 determines a gain setting value based on the gain increasing/decreasing signal from the fine adjustment circuit 63 and outputs the determined gain setting value to the variable gain amplifier 41.

In fine adjustment processing, by setting a time constant according to a detection accuracy of a necessary average power value, the signal level of the reception digital signal r(t) can be kept constant with a high accuracy.

The fine adjustment processing of Step S2 is continuously performed until the reception digital signal r(t) is not supplied anymore from the A/D converter 42. When the reception digital signal r(t) is not supplied anymore from the A/D converter 42, the automatic gain control processing is terminated.

<Processing Flow of Rough Control Processing>

Figure 5:
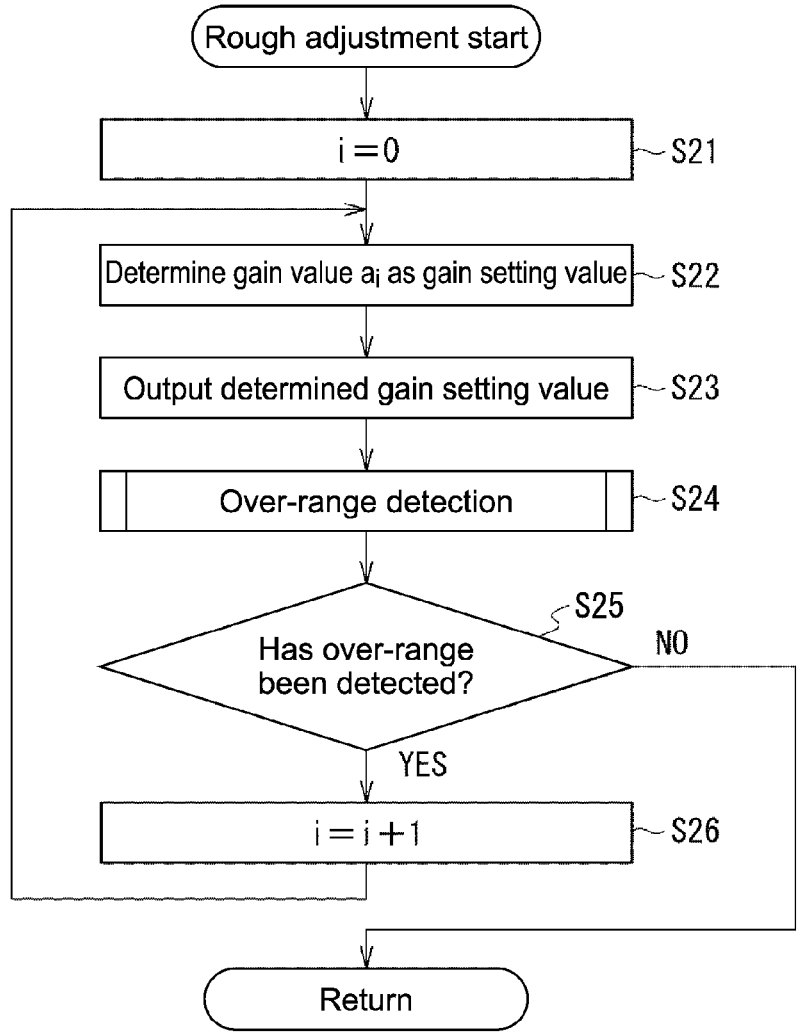
FIG. 5 is a flowchart explaining rough control processing.

FIG. 5 is a detailed flowchart of the above-mentioned rough control processing of Step S1.

In the rough control processing, first, in Step S21, the gain setting unit 64 of the automatic gain control circuit 44 sets an internal variable i to zero (i=0).

In Step S22, the gain setting unit 64 determines, from a rough adjustment gain value table $\{a_0, a_1, \ldots, a_{n-1}\}$ stored therein, a gain value $a_i$ corresponding to the value of the internal variable i as the gain setting value. At the beginning of the rough control processing, an initial value $a_0$ of the gain value is determined as the gain setting value. The gain value $a_i$ (i=0 to n−1) is a predetermined value. Note that, without using the rough adjustment gain value table $\{a_0, a_1, \ldots, a_{n-1}\}$ only the initial value $a_0$ of the gain value may be stored in advance and the gain setting value may be determined such that the value is decreased by a fixed value or ratio.

Then, in Step S23, the gain setting unit 64 outputs the determined gain setting value to the variable gain amplifier 41.

In Step S24, the over-range detection circuit 62 performs the over-range detection processing.

Referring to the flowchart of FIG. 6, details of the over-range detection processing in Step S24 will be described.

First, in Step S41, the over-range detection circuit 62 initializes the upper count value $c_u$, the lower count value $c_l$, and a number-of-samples count value $c_s$. That is, the upper count value $c_u$, the lower count value $c_l$, and the number-of-samples count value $c_s$ are reset to zero.

In Step S42, the over-range detection circuit 62 acquires the sample data $v_O$ of the one-step time and increments, in Step S43, the number-of-samples count value $c_s$ by one.

In Step S44, the level comparator 91 of the over-range detection circuit 62 compares the sample data $v_O$ of the obtained one-step time with the threshold $t_u$ and determines whether or not the sample data $v_O$ is larger than the threshold $t_u$. A judgment result is supplied from the level comparator 91 to the counter 92.

In Step S44, if it is judged that the sample data $v_O$ is larger than the threshold $t_u$, the processing proceeds to Step S45. The counter 92 increments the upper count value $c_u$ by one and then the processing proceeds to Step S46.

Meanwhile, in Step S44, if it is judged that the sample data $v_O$ is equal to or smaller than the threshold $t_u$, the processing directly proceeds to Step S46 without Step S45.

In Step S46, the level comparator 101 compares the sample data $v_O$ of the acquired one-step time with the threshold $t_l$ and judges whether or not the sample data $v_O$ is smaller than the threshold $t_l$. A judgment result is supplied from the level comparator 101 to the counter 102.

In Step S46, if it is judged that the sample data $v_O$ is smaller than the threshold $t_l$, the processing proceeds to Step S47. The counter 102 increments the lower count value $c_l$ by one and then the processing proceeds to Step S48.

Meanwhile, in Step S46, if it is judged that the sample data $v_O$ is equal to or larger than the threshold $t_l$, the proceeding directly proceeds to Step S48 without Step S47.

In Step S48, the over-range detection circuit 62 judges whether or not the number-of-samples count value $c_s$ is smaller than T, that is, whether or not the comparison of the reception digital signal r(t) with the thresholds $t_u$ and $t_l$ has been continuously performed for the T-time set in advance.

In Step S48, if it is judged that the number-of-samples count value $c_s$ is smaller than T, that is, the comparison of the reception digital signal r(t) for the T-time has not yet been performed, the processing returns to Step S42 and the above-mentioned processing of Steps S42 to S48 is performed again.

Out of the above-mentioned processing, the processing of Steps S44 and S45 and the processing of Steps S46 and S47, in other words, processing of judging the upper limit value of the conversion voltage range of the A/D converter 42 and processing of judging the lower limit value can be performed in parallel at the same time.

Then, in Step S48, if it is judged that the comparison of the reception digital signal r(t) for the T-time is performed, the processing proceeds to Step S49.

In Step S49, the counter 92 outputs the upper count value $c_u$ to the count comparator 93. Then, the count comparator 93 compares the upper count value $c_u$ supplied from the counter 92 with the threshold $t_c$ and judges whether or not the upper count value $c_u$ is larger than the threshold $t_c$.

In Step S49, if it is judged that the upper count value $c_u$ is larger than the threshold $t_c$, the processing proceeds to Step S50. The count comparator 93 sets the range upper limit detection signal d1 to one (d1=1) and outputs, to the AND circuit 83, the range upper limit detection signal d1 indicating the fact that the reception digital signal r(t) is larger than the upper limit value of the conversion voltage range of the A/D converter 42.

Meanwhile, in Step S49, if it is judged that the upper count value $c_u$ is equal to or smaller than the threshold $t_c$, the processing proceeds to Step S51. The count comparator 93 sets the range upper limit detection signal d1 to zero (d1=0) and outputs, to the AND circuit 83, the range upper limit detection signal d1 indicating the fact that the reception digital signal r(t) is not larger than the upper limit value of the conversion voltage range of the A/D converter 42.

Next, in Step S52, the counter 102 outputs the lower count value $c_l$ to the count comparator 103. Then, the count comparator 103 compares the lower count value $c_l$ supplied from the counter 102 with the threshold $t_c$ and judges whether or not the lower count value $c_l$ is larger than the threshold $t_c$.

In Step S52, if it is judged that the lower count value $c_l$ is larger than the threshold $t_c$, the processing proceeds to Step S53. The count comparator 103 sets the range lower limit detection signal d2 to one (d2=1) and outputs, to the AND circuit 83, the range lower limit detection signal d2 indicating the fact that the reception digital signal r(t) is larger than the lower limit value of the conversion voltage range of the A/D converter 42.

Meanwhile, in Step S52, it is judged that the lower count value $c_l$ is equal to or smaller than the threshold $t_c$, the processing proceeds to Step S54. The count comparator 103 sets the range lower limit detection signal d2 to zero (d2=0) and outputs, to the AND circuit 83, the range lower limit detection signal d2 indicating the fact that the reception digital signal r(t) is not larger than the lower limit value of the conversion voltage range of the A/D converter 42.

The processing of Steps S49 to S51 and the processing of Steps S52 to S54 can be performed in parallel at the same time.

Then, in Step S55, the AND circuit 83 calculates a logical product of the range upper limit detection signal d1 output from the count comparator 93 and the range lower limit detection signal d2 output from the count comparator 103 and outputs the computing result as the over-range detection signal d.

With this, if the input signal into the A/D converter 42 is within the conversion voltage range of the A/D converter 42, the over-range detection signal d of d=0 is output to the gain setting unit 64. If the input signal into the A/D converter 42 is out of the conversion voltage range, the over-range detection signal d of d=1 is output to the gain setting unit 64.

After the processing of Step S55 is terminated, the processing returns to FIG. 5 and proceeds to Step S25.

Then, in Step S25 of FIG. 5, the gain setting unit 64 judges, based on the over-range detection signal d supplied from the over-range detection circuit 62, whether or not the over-range has been detected.

In Step S25, if it is judged that the over-range has been detected, that is, the over-range detection signal d of d=1 is supplied from the over-range detection circuit 62, the processing proceeds to Step S26 and the gain setting unit 64 increments the internal variable i by one. After that, the processing returns to Step S22 and the above-mentioned processing of Steps 22 to S25 is performed again. That is, from the rough adjustment gain value table $\{a_1, a_2, \ldots, a_{n-1}\}$ stored therein, the next gain value $a_i$ is determined as the gain setting value and set in the variable gain amplifier 41. Then, whether or not the over-range has been detected is judged.

Figure 4:
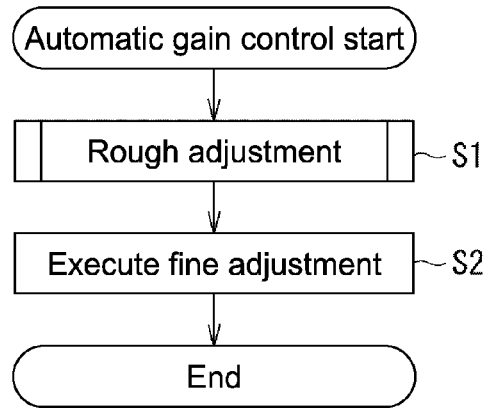
FIG. 4 is a flowchart explaining automatic gain control processing.

Meanwhile, in Step S25, if it is judged that the over-range has not been detected, that is, if the over-range detection signal d of d=0 is supplied from the over-range detection circuit 62, the rough control processing of FIG. 5 is terminated and the processing proceeds to Step S2 of FIG. 4.

Immediately after the gain value of the variable gain amplifier 41 is largely changed, a large offset x is in some cases caused in an output signal from the variable gain amplifier 41. If a large offset x is caused in the output signal from the variable gain amplifier 41, for example, in the method of comparing an average signal power E with a threshold $t_E$, which is described in Patent Document 1, a signal whose average signal power is $(t_E-x^2)<E<t_E$ is erroneously detected as an over-range.

Further, in the method of comparing a signal level absolute value with a threshold th, which is described in Patent Documents 2 to 4, the sample data $v_0$ where $(th-x)<v_0<th$ if the offset x is positive or the sample data $v_0$ where $(-th)<v_0<(-th-x)$ if the offset x is negative is erroneously detected as an over-range.

In contrast, according to the automatic gain control processing of the automatic gain control circuit 44, in the rough control processing, only if the number of times (upper count value $c_u$) when the reception digital signal r(t) exceeds the upper limit value of the conversion voltage range of the A/D converter 42 (threshold $t_u$) and the number of times (lower count value $c_l$) when the reception digital signal r(t) exceeds the lower limit value (threshold $t_l$) are both larger than the threshold $t_c$, it is judged as an over-range.

If a large offset x is caused in the output signal from the variable gain amplifier 41, for example, if the offset x is positive, the number of times when the reception digital signal r(t) exceeds the upper limit value is statistically increased while the number of times when the reception digital signal r(t) exceeds the lower limit value is decreased. In contrast, if the offset x is negative, the number of times when the reception digital signal r(t) exceeds the lower limit value is increased while the number of times when the reception digital signal r(t) exceeds the upper limit value is decreased.

Thus, if an offset is caused in the reception signal not judged as an over-range when the offset is not caused, in other words, the reception signal whose upper count value $c_u$ and lower count value $c_l$ are both equal to or smaller than the threshold $t_c$ when the offset is not caused, either one of the upper count value $c_u$ and the lower count value $c_l$ is equal to or smaller than the threshold $t_c$. Thus, the above-mentioned condition that "the upper count value $c_u$ and the lower count value $c_l$ are both larger than the threshold $t_c$" as the criteria of the judgment of the over-range is not satisfied.

Thus, according to the automatic gain control circuit 44 of FIG. 2, it is possible to reduce the frequency of erroneous over-range detection if the large offset is caused in the output signal from the variable gain amplifier 41, and thus to reduce the gain control adjustment time.

That is, according to the automatic gain control circuit 44, it is possible to further increase the gain control speed.

<3. Second Embodiment of Automatic Gain Control Circuit>
<Second Configuration Example of Automatic Gain Control Circuit>

Next, a second embodiment of the automatic gain control circuit 44 will be described.

If the input signal into the A/D converter 42 is a signal out of the conversion voltage range of the A/D converter 42, the A/D converter 42 at the previous stage of the automatic gain control circuit 44 may have a function of outputting a signal indicating the fact (hereinafter, referred to as out-of-range detection signal output function).

In the second embodiment, the A/D converter 42 shows a configuration of the automatic gain control circuit 44 having the out-of-range detection signal output function. Hereinafter, the description will be made referring the A/D converter 42 having the out-of-range detection signal output function to as an A/D converter 42B.

Figure 7:
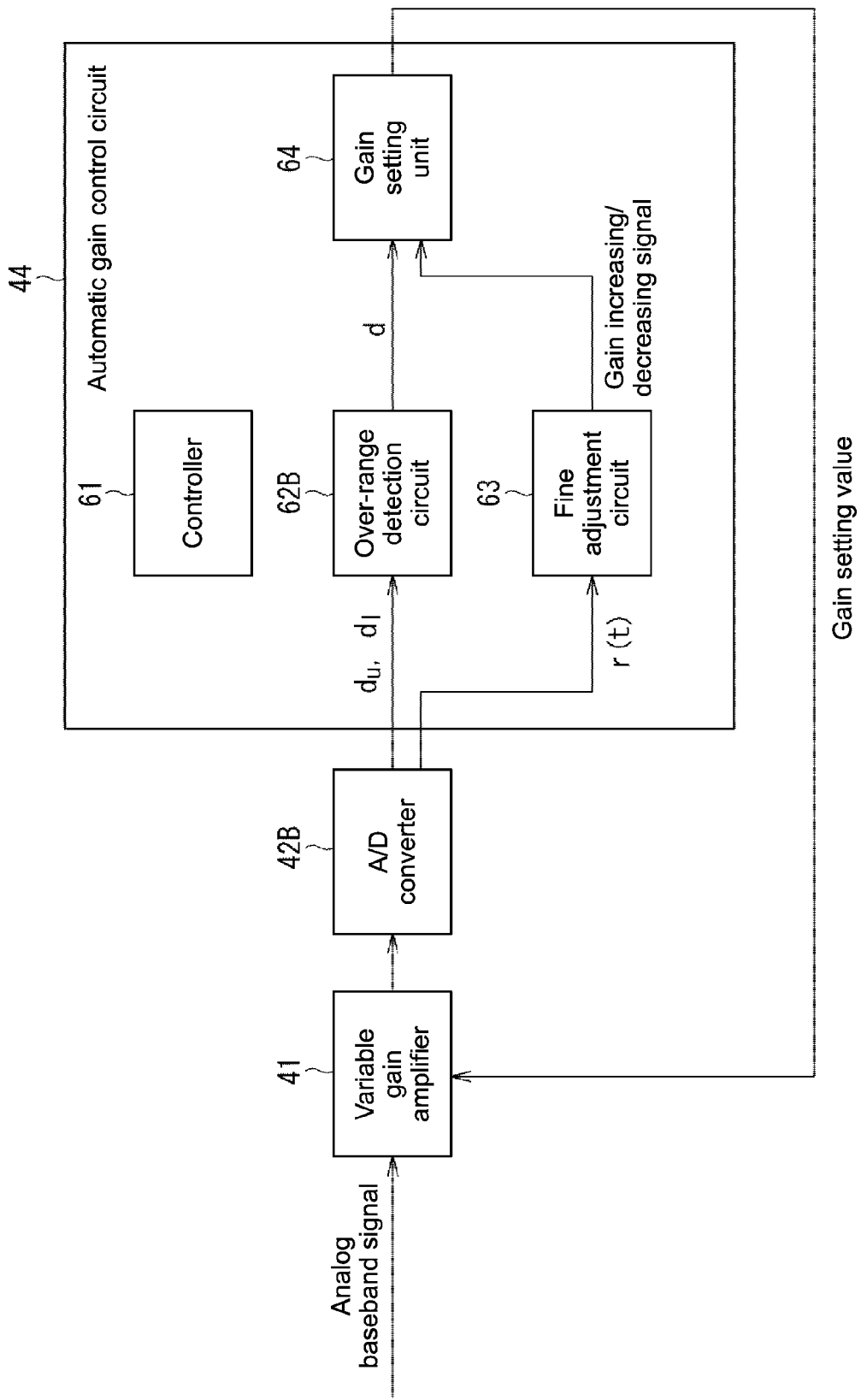
FIG. 7 is a block diagram showing a second embodiment of the automatic gain control circuit.

FIG. 7 is a block diagram showing a detailed configuration example of an automatic gain control circuit 44 in the second embodiment.

Note that, in FIG. 7, portions corresponding to those of FIG. 2 in the first embodiment will be denoted by the same reference symbols and portions different from those in the first embodiment will be focused in the following description.

As in the first embodiment, the A/D converter 42B samples an analog baseband signal supplied from the variable gain amplifier 41 in a predetermined sample cycle and outputs data obtained by the sampling to the reception filter 43 (FIG. 1) and the fine adjustment circuit 63 of the automatic gain control circuit 44 as the reception digital signal r(t).

Further, if the input signal into the A/D converter 42B is a signal out of the conversion voltage range of the A/D converter 42B, the A/D converter 42B has a function of outputting a signal indicating the fact.

More specifically, if the input signal into the A/D converter 42B is a signal larger than an upper limit of the conversion voltage range of the A/D converter 42B, the A/D converter 42B outputs an out-of-range detection signal $d_u$ indicating the fact to an over-range detection circuit 62B of the automatic gain control circuit 44.

Further, if the input signal into the A/D converter 42B is a signal smaller than the lower limit of the conversion voltage range of the A/D converter 42B, the A/D converter 42B outputs an out-of-range detection signal $d_l$ indicating the fact to the over-range detection circuit 62B of the automatic gain control circuit 44.

The automatic gain control circuit 44 is configured by the controller 61, the over-range detection circuit 62B, the fine adjustment circuit 63, and the gain setting unit 64.

As described above, the out-of-range detection signal $d_u$ and the out-of-range detection signal $d_l$ are supplied from the A/D converter 42B to the over-range detection circuit 62B.

Based on the out-of-range detection signal $d_u$ and the out-of-range detection signal $d_l$ from the A/D converter 42B, the over-range detection circuit 62B outputs the over-range detection signal d of d=0 in the case where the input signal into the A/D converter 42B is within the conversion voltage range of the A/D converter 42B and outputs the over-range detection signal d of d=1 in the case where it is out of the conversion voltage range.

<Second Configuration Example of Over-Range Detection Circuit>

Figure 8:
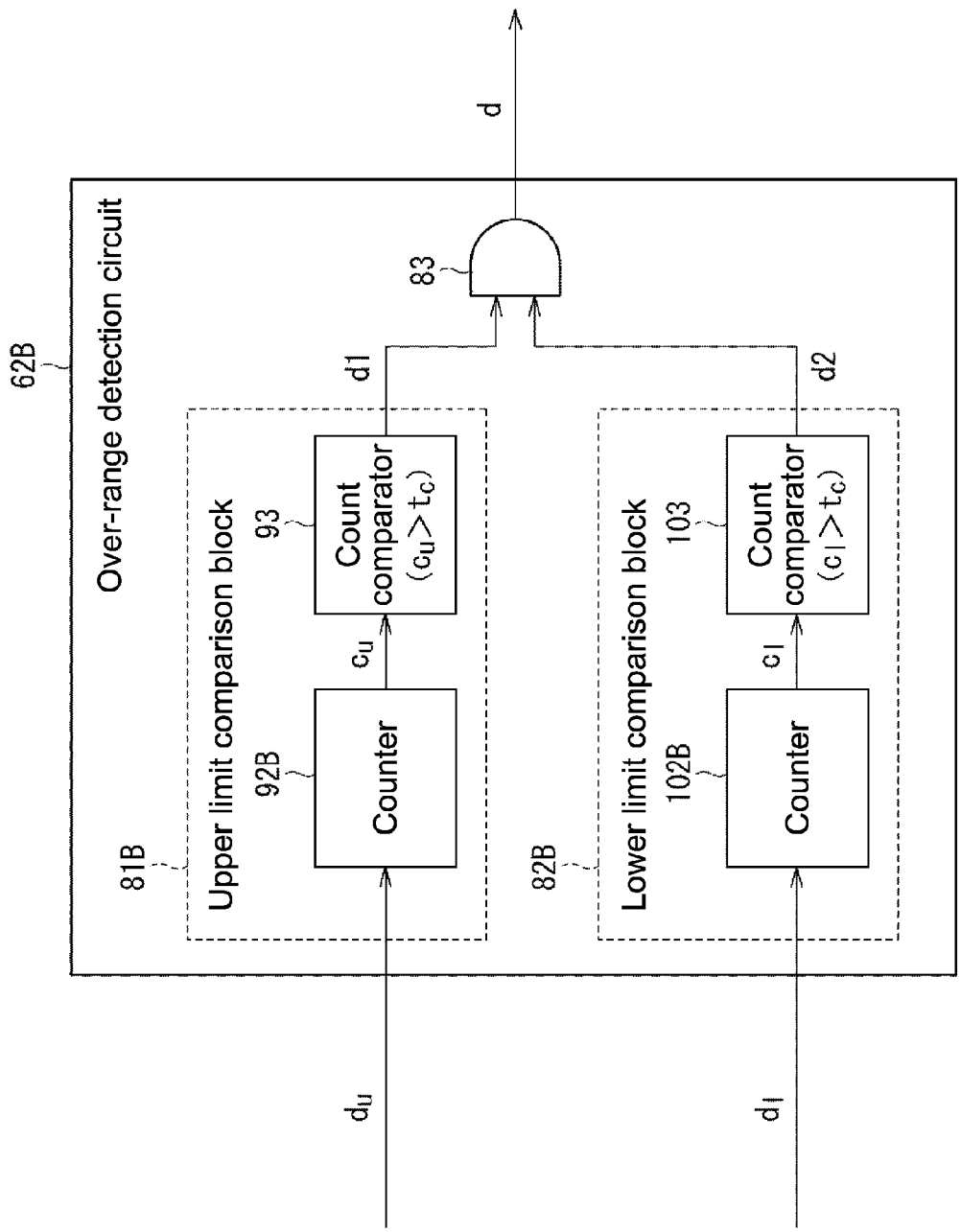
FIG. 8 is a block diagram showing a second configuration example of the over-range detection circuit.

FIG. 8 is a block diagram showing a detailed configuration example of the over-range detection circuit 62B of FIG. 7.

The over-range detection circuit 62B is configured by an upper limit comparison block 81B, a lower limit comparison block 82B, and the AND circuit 83. The upper limit comparison block 81B is configured by the counter 92B and the count comparator 93 and the lower limit comparison block 82B is configured by a counter 102B and the count comparator 103.

That is, in the upper limit comparison block 81B of the over-range detection circuit 62B, the level comparator 91 of the first embodiment is omitted and the out-of-range detection signal $d_u$ output from the A/D converter 42B is input into a counter 92B.

Further, in the lower limit comparison block 82B of the over-range detection circuit 62B, the level comparator 101 of the first embodiment is omitted and the out-of-range detection signal $d_l$ output from the A/D converter 42B is input into the counter 102B.

Instead of the comparison result supplied from the level comparator 91 in the first embodiment, the counter 92B counts the number of times of the out-of-range detection signal $d_u$ supplied from the A/D converter 42B as the upper count value $c_u$. The counter 92B outputs the upper count value $c_u$ to the count comparator 93 after the T-time has elapsed.

Instead of the comparison result supplied from the level comparator 101 in the first embodiment, the counter 102B counts the number of times of the out-of-range detection signal $d_l$ supplied from the A/D converter 42B as the lower count value $c_l$. The counter 102B outputs the lower count value $c_l$ to the count comparator 103 after the T-time has elapsed.

The operation of the AND circuit 83 is the same as that of the first embodiment. That is, the AND circuit 83 calculates a logical product of the range upper limit detection signal d1 output from the upper limit comparison block 81B and the range lower limit detection signal output from the lower limit comparison block 82B and outputs a calculation result thereof as the over-range detection signal d.

<Over-Range Detection Processing>

Referring to the flowchart of FIG. 9, details of the over-range detection processing of Step S24 in FIG. 5 by the over-range detection circuit 62B will be described.

Figure 9:
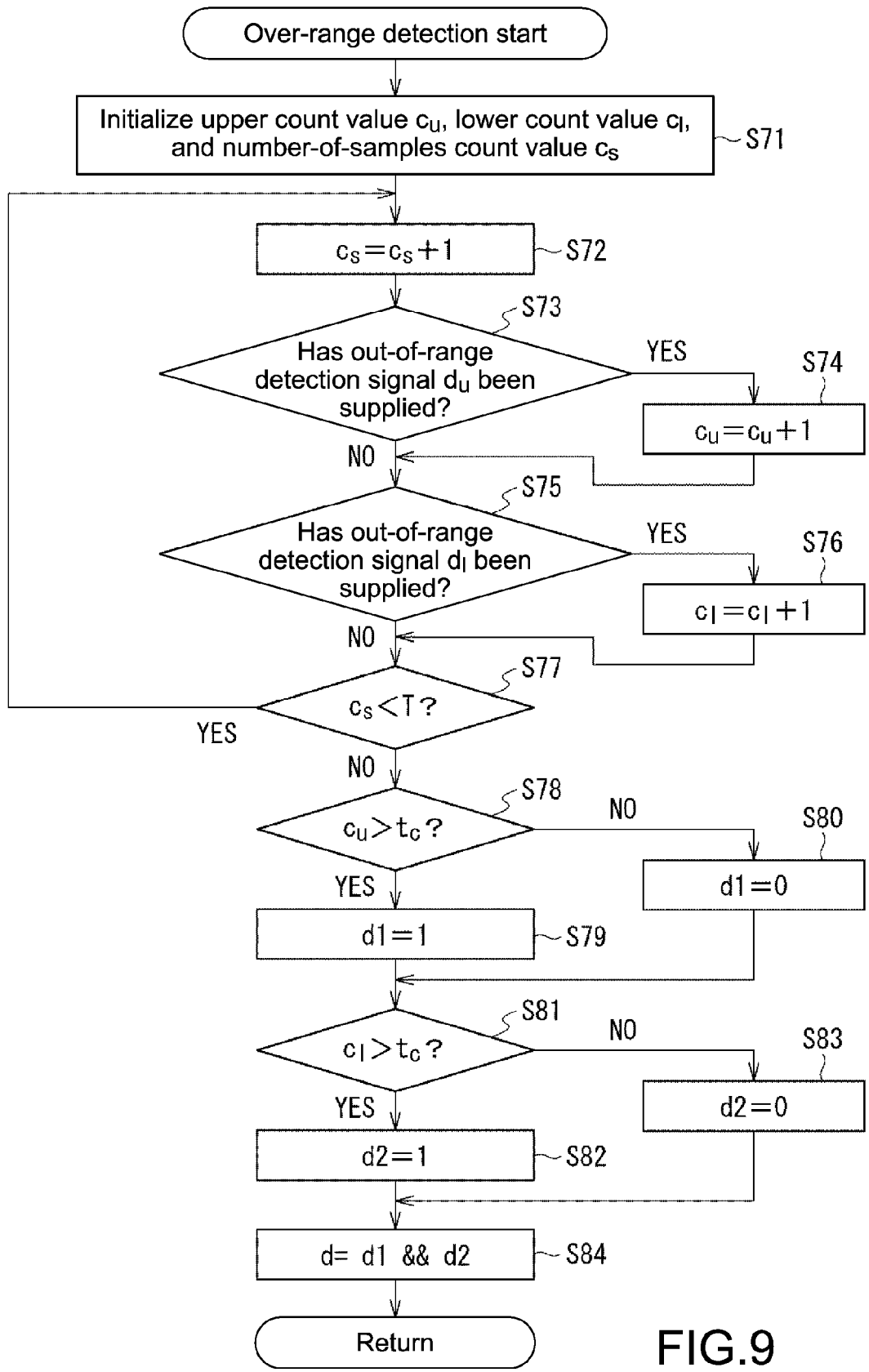
FIG. 9 is a flowchart explaining over-range detection processing.

In the over-range detection processing of FIG. 9, first, in Step S71, the over-range detection circuit 62B initializes the upper count value $c_u$, the lower count value $c_l$, and the number-of-samples count value $c_s$. That is, the upper count value $c_u$, the lower count value $c_l$, and the number-of-samples count value $c_s$ are reset to zero.

In Step S72, the over-range detection circuit 62B increments the number-of-samples count value $c_s$ by one.

In Step S73, the counter 92B judges whether or not the out-of-range detection signal $d_u$ indicating the fact that the input signal into the A/D converter 42B is a signal larger than the upper limit of the conversion voltage range of the A/D converter 42B has been supplied from the A/D converter 42B within the one-step time.

In Step S73, if it is judged that the out-of-range detection signal $d_u$ has been supplied from the A/D converter 42B within the one-step time, the processing proceeds to Step S74. The counter 92B increments the upper count value $c_u$ by one and then the processing proceeds to Step S75.

Meanwhile, in Step S73, if it is judged that the out-of-range detection signal $d_u$ has not been supplied from the A/D converter 42B within the one-step time, the processing directly proceeds to Step S75 without Step S74.

In Step S75, the counter 102B judges whether or not the out-of-range detection signal $d_l$ indicating the fact that the input signal into the A/D converter 42B is a signal smaller than the lower limit of the conversion voltage range of the A/D converter 42B has been supplied from the A/D converter 42B within the one-step time.

In Step S75, if it is judged that the out-of-range detection signal $d_l$ has been supplied from the A/D converter 42B within the one-step time, the processing proceeds to Step S76. The counter 102B increments the lower count value $c_l$ by one and then the processing proceeds to Step S77.

Meanwhile, in Step S75, also if it is judged that the out-of-range detection signal $d_l$ has not been supplied form the A/D converter 42B within the one-step time, the processing directly proceeds to Step S77 without Step S76.

Figure 6:
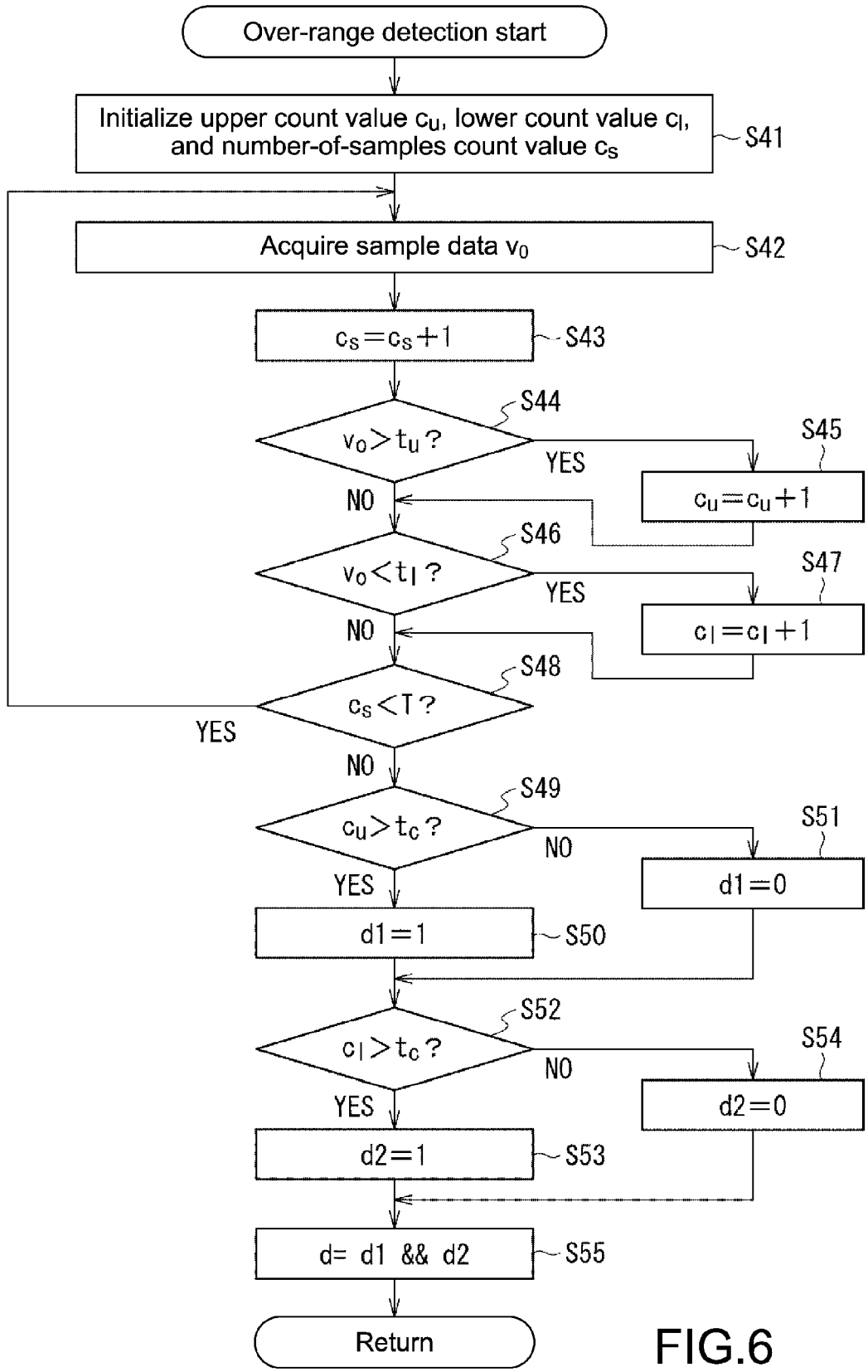
FIG. 6 is a flowchart explaining over-range detection processing.

The processing of Steps S77 to S84 after that is the same as the processing of Steps S48 to S55 in FIG. 6, and hence descriptions thereof will be omitted.

Further, the respective processes of the rough control processing other than the over-range detection processing and the fine adjustment processing are the same as the processes described above with reference to FIGS. 4 and 5.

Also in the automatic gain control processing of the automatic gain control circuit 44 in the second embodiment, only if the number of times (upper count value $c_u$) when the reception digital signal r(t) exceeds the upper limit value of the conversion voltage range of the A/D converter 42 (threshold $t_u$) and the number of times (lower count value $c_l$) when the reception digital signal r(t) exceeds the lower limit value (threshold $t_l$) are both larger than the threshold $t_c$, it is judged as an over-range. Therefore, if an offset is caused in a reception signal not judged as an over-range when the offset is not caused, it is not judged as an over-range.

Thus, it is possible to reduce the frequency of erroneous over-range detection if the large offset is caused in the output signal from the variable gain amplifier 41 and the gain control adjustment time can be reduced.

Comparing the processing of the first embodiment with the processing of the second embodiment, the configuration of the second embodiment can adjust a gain at higher accuracy.

For example, a case where the conversion voltage range of the A/D converter 42 (42B) is −15 to +15 [V] and the reception digital signal r(t) of the upper limit value of +15[V] is output from the A/D converter 42 (42B) will be discussed.

In the first embodiment, whether or not the input signal into the A/D converter 42 is a signal equal to or larger than the upper limit value cannot be known. Such a judgment is possible in the second embodiment, and hence it is possible to detect the over-range at higher accuracy and control the gain.

Although, in the first and second embodiments, a threshold serving as a judgment reference of the range upper limit detection signal d1 and a threshold serving as a judgment reference of the range lower limit detection signal d2 are the same value (threshold $t_c$), these values may be different.

Further, for example, if the A/D converter 42B functions to output only either one of the out-of-range detection signal $d_u$ on the upper side and the out-of-range detection signal $d_l$ on the lower side, the automatic gain control circuit 44 can be configured by combining the configuration of the first embodiment with the configuration of the second embodiment.

More specifically, if the A/D converter 42B functions to output only the out-of-range detection signal $d_u$ on the upper side, the automatic gain control circuit 44 including the over-range detection circuit 62 formed of the upper limit comparison block 81B of the second embodiment, the lower limit comparison block 82 of the first embodiment, and the AND circuit 83 can be provided.

Meanwhile, if the A/D converter 42B functions to output only either one of the out-of-range detection signal $d_l$ on the lower side, the automatic gain control circuit 44 including the over-range detection circuit 62 formed of the upper limit comparison block 81 of the first embodiment, the lower limit comparison block 82B of the second embodiment, and the AND circuit 83 can be provided.

<4. Other Configuration Examples of Over-Range Detection Circuit>

<Third Configuration Example of Over-Range Detection Circuit>

Figure 10:
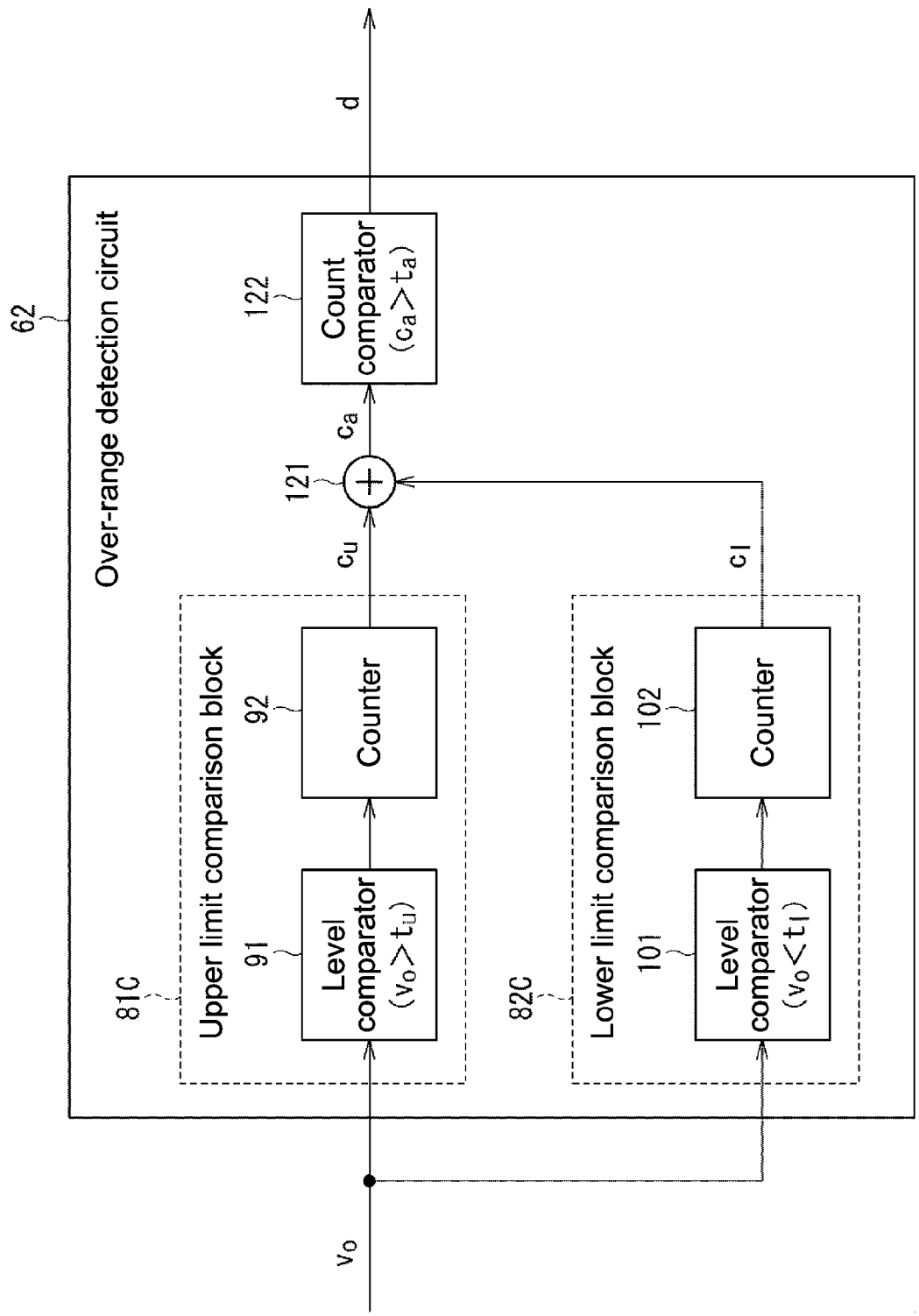
FIG. 10 is a block diagram showing a third configuration example of the over-range detection circuit.

FIG. 10 is a block diagram showing a detailed configuration example of the over-range detection circuit 62 applicable to the first embodiment, which is the third configuration example of the over-range detection circuit 62.

The over-range detection circuit 62 shown in FIG. 10 includes an upper limit comparison block 81C, a lower limit comparison block 82C, the adder 121, and a count comparator 122.

The upper limit comparison block 81C includes the level comparator 91 and the counter 92 and outputs the upper count value $c_u$ that is the number of times when the sample data $v_0$ larger than the threshold $t_u$ is obtained to the adder 121.

The lower limit comparison block 82C includes the level comparator 101 and the counter 102 and outputs the lower count value $c_l$ that is the number of times when the sample data $v_0$ smaller than the threshold $t_l$ is obtained to the adder 121.

The adder 121 adds the upper count value $c_u$ from the upper limit comparison block 81C and the lower count value $c_l$ from the lower limit comparison block 82C and outputs an addition result $c_a$ thereof to the count comparator 122.

The count comparator 122 compares the addition result $c_a$ supplied from the adder 121 with a threshold $t_a$ set in advance and outputs the over-range detection signal d based on the comparison result.

More specifically, if the addition result $c_a$ is equal to or smaller than the threshold $t_a$, the count comparator 122 outputs the over-range detection signal d of d=0 indicating that the input signal into the A/D converter 42 is within the conversion voltage range of the A/D converter 42. Meanwhile, if the addition result $c_a$ is larger than the threshold $t_a$, the count comparator 122 outputs the over-range detection signal d of d=1 indicating that the input signal into the A/D converter 42 is out of the conversion voltage range of the A/D converter 42.

The count comparator 122 configures an over-range detector that detects an over-range based on a comparison result obtained by comparing the addition result $c_a$ obtained by adding the upper count value $c_u$ and the lower count value $c_l$ with the threshold $t_a$.

<Over-Range Detection Processing>

Figure 11:
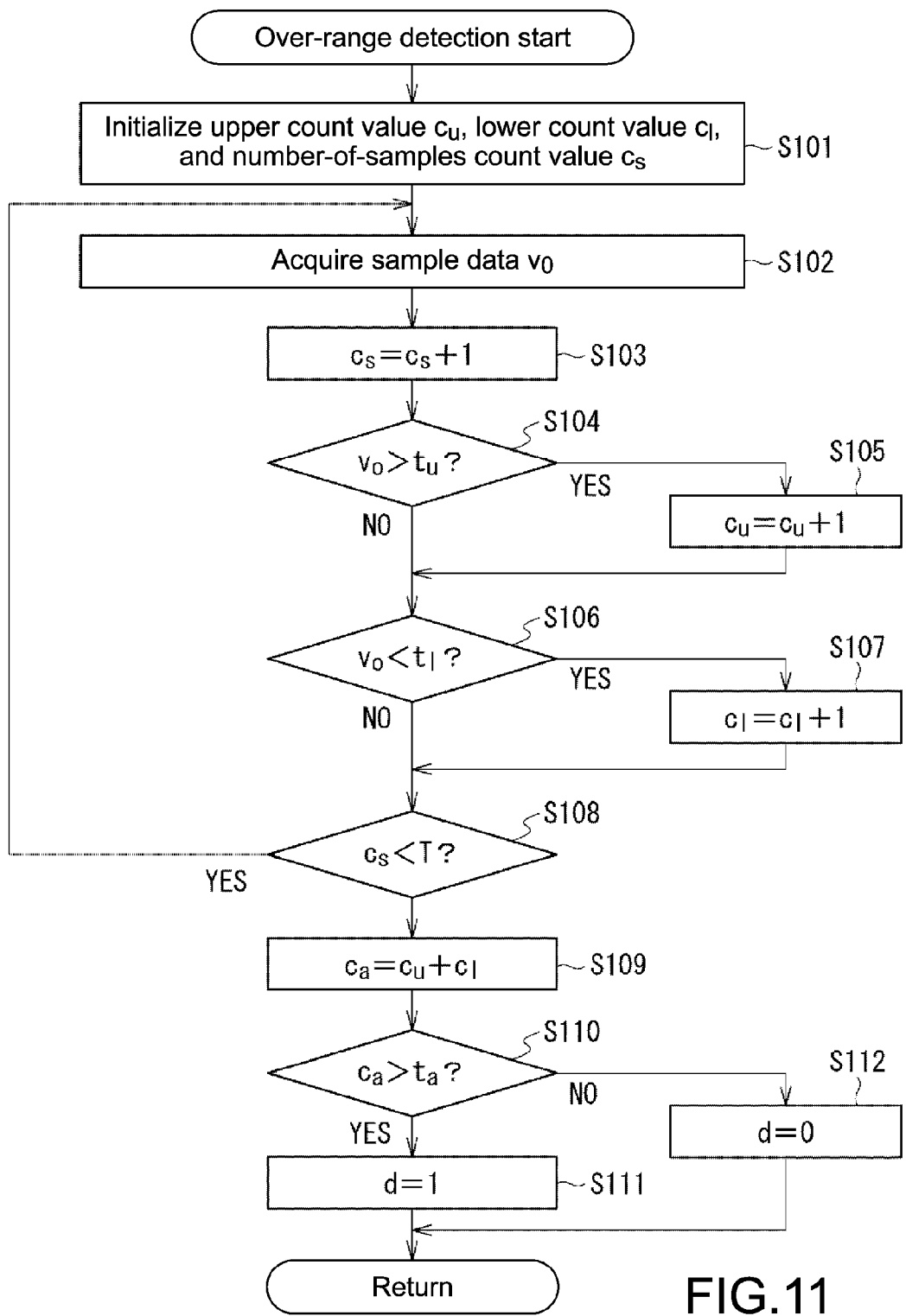
FIG. 11 is a flowchart explaining over-range detection processing.

Referring to the flowchart of FIG. 11, details of the over-range detection processing of Step S24 in FIG. 5 according to the third configuration example of the over-range detection circuit will be described.

The processing of Steps S101 to S108 are the same as the processing of Steps S41 to S48 in FIG. 6, and hence a description thereof will be omitted.

In Step S109, the counter 92 of the upper limit comparison block 81C outputs the upper count value $c_u$ to the adder 121 and the counter 102 of the lower limit comparison block 82C outputs the lower count value $c_l$ to the adder 121. Then, the adder 121 adds the upper count value $c_u$ from the upper limit comparison block 81C and the lower count value $c_l$ from the lower limit comparison block 82C and outputs an addition result $c_a$ thereof to the count comparator 122.

In Step S110, the count comparator 122 judges whether or not the addition result $c_a$ is larger than the threshold $t_a$.

In Step S110, if it is judged that the addition result $c_a$ is larger than the threshold $t_a$, the processing proceeds to Step S111. The count comparator 122 outputs the over-range detection signal d of d=1 indicating that the input signal into the A/D converter 42 is out of the conversion voltage range of the A/D converter 42.

Meanwhile, in Step S110, if it is judged that the addition result $c_a$ is equal to or smaller than the threshold $t_a$, the processing proceeds to Step S112. The count comparator 122 outputs the over-range detection signal d of d=0 indicating that the input signal into the A/D converter 42 is within the conversion voltage range of the A/D converter 42.

Hereinafter, the over-range detection processing is terminated.

The configuration of comparing and judging the addition result $c_a$ of the upper count value $c_u$ from the upper limit comparison block 81C and the lower count value $c_l$ from the lower limit comparison block 82C with the threshold $t_a$, which characterizes the third configuration example of the over-range detection circuit 62, can also be a configuration adapted for the A/D converter 42B having the out-of-range detection signal output function.

In this case, the upper limit comparison block 81C of FIG. 10 is configured by the counter 92B of FIG. 8 instead of the level comparator 91 and the counter 92. Further, the lower limit comparison block 82C of FIG. 10 is configured by the counter 102B of FIG. 8 instead of the level comparator 101 and the counter 102.

By comparing and judging the addition result $c_a$ of the upper count value $c_u$ from the upper limit comparison block 81C and the lower count value $c_l$ from the lower limit comparison block 82C with the threshold $t_a$, the over-range detection circuit 62 in the third configuration example can reduce the frequency of erroneous over-range detection in the case where a large offset is caused in the output signal from the variable gain amplifier 41 and the gain control adjustment time can be reduced.

Although, in the above-mentioned example, the automatic gain control circuit 44 is provided as a part of the configuration of the receiver 2, the automatic gain control circuit 44 can be configured as an independent automatic gain control apparatus and incorporated in any communication apparatus.

Note that, in this specification, the system means a collection of a plurality of components (apparatuses, modules (parts), etc.) and all the components may be in the same casing or do not need to be in the same casing. Thus, a plurality of apparatuses housed in separate casings and connected via a network and an apparatus with a plurality of modules in the same casing are both the system.

The embodiments of the present technology are not limited to the above-mentioned embodiments and various changes can be made without departing from the gist of the present technology.

For example, an embodiment combining all or some of the above-mentioned embodiments can be employed.

Further, the steps described above referring to the flowchart can be performed by a single apparatus or shared and performed by a plurality of apparatuses.

In addition, if a single step includes a plurality of processes, the plurality of processes of the single step can be performed by a single apparatus or shared and performed by a plurality of apparatuses.

Note that the present technology may also take the following configurations.

(1) An automatic gain control apparatus, including:
a first counter configured to calculate a first count value that is the number of times when a voltage of an input signal exceeds a first voltage threshold within a predetermined period;
a second counter configured to calculate a second count value that is the number of times when the voltage of the input signal drops below a second voltage threshold in the predetermined period; and
an over-range detector configured to detect an over-range, based on a comparison result obtained by comparing either one of each of the first count value and the second count value and a calculation result of the first count value and the second count value with a predetermined threshold, and output a detection result.

(2) The automatic gain control apparatus according to (1), further including:
a first comparator configured to compare the first count value with a first threshold and output a comparison result thereof; and
a second comparator configured to compare the second count value with a second threshold and output a comparison result thereof, in which
the over-range detector is configured to detect an over-range based on the comparison result of the first comparator and the comparison result of the second comparator and output a detection result.

(3) The automatic gain control apparatus according to (1) or (2), in which
the first threshold and the second threshold are equal.
(4) The automatic gain control apparatus according to (1) or (2), in which
the first threshold and the second threshold are different.
(5) The automatic gain control apparatus according to any one of (1) to (4), in which
the first counter is configured to calculate the first count value based on a first out-of-range detection signal indicating that the voltage of the input signal is above the first voltage threshold, and
the second counter is configured to calculate the second count value based on a second out-of-range detection signal indicating that the voltage of the input signal is below the second voltage threshold.
(6) The automatic gain control apparatus according to (5), in which
the first out-of-range detection signal and the second out-of-range detection signal are output from an analog/digital converter.
(7) The automatic gain control apparatus according to any one of (1) to (6), further including:
a first voltage comparator configured to compare the voltage of the input signal with the first voltage threshold and output a comparison result thereof; and
a second voltage comparator configured to compare the voltage of the input signal with the second voltage threshold and output a comparison result thereof, in which
the first counter is configured to calculate the first count value based on the comparison result of the first voltage, and
the second counter is configured to calculate the second count value based on the comparison result of the second voltage comparator.
(8) The automatic gain control apparatus according to any one of (1) to (7), in which
the over-range detector is configured to detect the over-range based on a comparison result obtained by comparing an addition result, which is obtained by adding the first count value and the second count value, with a third count value, and to output a detection result.
(9) The automatic gain control apparatus according to any one of (1) to (8), further including
a gain setting unit configured to determine and output a gain setting value when the over-range detector detects the over-range.
(10) The automatic gain control apparatus according to any one of (1) to (9), further including
an adjustment unit configured to output, when the over-range detector does not detect the over-range, a gain increasing/decreasing signal for increasing and decreasing a gain value based on a power difference from a target power value.
(11) The automatic gain control apparatus according to any one of (1) to (10), in which
the voltage of the input signal is a digital value output from an analog/digital converter.
(12) An automatic gain control method for an automatic gain control apparatus including a first counter, a second counter, and an over-range detector, the method including:
calculating, by the first counter, a first count value that is the number of times when a voltage of an input signal exceeds a first voltage threshold within a predetermined period;
calculating, by the second counter, a second count value that is the number of times when the voltage of the input signal drops below a second voltage threshold in the predetermined period; and
detecting, by the over-range detector, an over-range based on a comparison result obtained by comparing either one of each of the first count value and the second count value and a calculation result of the first count value and the second count value with a predetermined threshold and outputting a detection result.
(13) A receiver, including:
a first counter configured to calculate a first count value that is the number of times when a voltage of an input signal exceeds a first voltage threshold within a predetermined period;
a second counter configured to calculate a second count value that is the number of times when the voltage of the input signal drops below a second voltage threshold in the predetermined period; and
an over-range detector configured to detect an over-range based on a comparison result obtained by comparing either one of each of the first count value and the second count value and a calculation result of the first count value and the second count value with a predetermined threshold, and output a detection result.
(14) The receiver according to (13), further including
an analog/digital converter configured to convert a voltage of an analog input signal into a digital value and output the digital value and to output a first out-of-range detection signal indicating that the voltage of the input signal is above a first voltage threshold and a second out-of-range detection signal indicating that the voltage of the input signal is below a second voltage threshold, in which
the first counter is configured to calculate the first count value based on the first out-of-range detection signal, and
the second counter is configured to calculate the second count value based on the second out-of-range detection signal.
(15) The receiver according to (13) or (14), further including
a radio-frequency (RF) circuit configured to convert a received RF signal into an analog baseband signal serving as the input signal.

It should be understood by those skilled in the art that various modifications, combinations, sub-combinations and alterations may occur depending on design requirements and other factors insofar as they are within the scope of the appended claims or the equivalents thereof.

What is claimed is:
1. An automatic gain control apparatus, comprising:
   a first counter configured to calculate a first count value that is the number of times when a voltage of an input signal exceeds a first voltage threshold within a predetermined period;
   a second counter configured to calculate a second count value that is the number of times when the voltage of the input signal drops below a second voltage threshold in the predetermined period; and
   an over-range detector configured to detect an over-range, based on a comparison result obtained by comparing either one of each of the first count value and the second count value and a calculation result of the first count value and the second count value with a predetermined threshold, and output a detection result.
2. The automatic gain control apparatus according to claim 1, further comprising:
   a first comparator configured to compare the first count value with a first threshold and output a comparison result thereof; and
   a second comparator configured to compare the second count value with a second threshold and output a comparison result thereof, wherein the over-range detector is configured to detect an over-range based on the comparison result of the first comparator and the comparison result of the second comparator and output a detection result.

3. The automatic gain control apparatus according to claim 2, wherein
the first threshold and the second threshold are equal.

4. The automatic gain control apparatus according to claim 2, wherein
the first threshold and the second threshold are different.

5. The automatic gain control apparatus according to claim 1, wherein
the first counter is configured to calculate the first count value based on a first out-of-range detection signal indicating that the voltage of the input signal is above the first voltage threshold, and
the second counter is configured to calculate the second count value based on a second out-of-range detection signal indicating that the voltage of the input signal is below the second voltage threshold.

6. The automatic gain control apparatus according to claim 5, wherein
the first out-of-range detection signal and the second out-of-range detection signal are output from an analog/digital converter.

7. The automatic gain control apparatus according to claim 1, further comprising:
a first voltage comparator configured to compare the voltage of the input signal with the first voltage threshold and output a comparison result thereof; and
a second voltage comparator configured to compare the voltage of the input signal with the second voltage threshold and output a comparison result thereof, wherein
the first counter is configured to calculate the first count value based on the comparison result of the first voltage, and
the second counter is configured to calculate the second count value based on the comparison result of the second voltage comparator.

8. The automatic gain control apparatus according to claim 1, wherein
the over-range detector is configured to detect the over-range based on a comparison result obtained by comparing an addition result, which is obtained by adding the first count value and the second count value, with a third count value, and to output a detection result.

9. The automatic gain control apparatus according to claim 1, further comprising
a gain setting unit configured to determine and output a gain setting value when the over-range detector detects the over-range.

10. The automatic gain control apparatus according to claim 1, further comprising
an adjustment unit configured to output, when the over-range detector does not detect the over-range, a gain increasing/decreasing signal for increasing and decreasing a gain value based on a power difference from a target power value.

11. The automatic gain control apparatus according to claim 1, wherein
the voltage of the input signal is a digital value output from an analog/digital converter.

12. An automatic gain control method for an automatic gain control apparatus including a first counter, a second counter, and an over-range detector, the method comprising:
calculating, by the first counter, a first count value that is the number of times when a voltage of an input signal exceeds a first voltage threshold within a predetermined period;
calculating, by the second counter, a second count value that is the number of times when the voltage of the input signal drops below a second voltage threshold in the predetermined period; and
detecting, by the over-range detector, an over-range based on a comparison result obtained by comparing either one of each of the first count value and the second count value and a calculation result of the first count value and the second count value with a predetermined threshold and outputting a detection result.

13. A receiver, comprising:
a first counter configured to calculate a first count value that is the number of times when a voltage of an input signal exceeds a first voltage threshold within a predetermined period;
a second counter configured to calculate a second count value that is the number of times when the voltage of the input signal drops below a second voltage threshold in the predetermined period; and
an over-range detector configured to detect an over-range based on a comparison result obtained by comparing either one of each of the first count value and the second count value and a calculation result of the first count value and the second count value with a predetermined threshold, and output a detection result.

14. The receiver according to claim 13, further comprising
an analog/digital converter configured to convert a voltage of an analog input signal into a digital value and output the digital value and to output a first out-of-range detection signal indicating that the voltage of the input signal is above a first voltage threshold and a second out-of-range detection signal indicating that the voltage of the input signal is below a second voltage threshold, wherein
the first counter is configured to calculate the first count value based on the first out-of-range detection signal, and
the second counter is configured to calculate the second count value based on the second out-of-range detection signal.

15. The receiver according to claim 13, further comprising
a radio-frequency (RF) circuit configured to convert a received RF signal into an analog baseband signal serving as the input signal.

* * * * *